(12) United States Patent
Hirano

(10) Patent No.: US 7,411,525 B2
(45) Date of Patent: Aug. 12, 2008

(54) SAMPLING RATE CONVERTING METHOD AND CIRCUIT

(75) Inventor: Takaaki Hirano, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 152 days.

(21) Appl. No.: 11/500,971

(22) Filed: Aug. 9, 2006

(65) Prior Publication Data

US 2007/0046507 A1 Mar. 1, 2007

(30) Foreign Application Priority Data

Aug. 30, 2005 (JP) .............................. 2005-249302

(51) Int. Cl.
*H03M 7/00* (2006.01)
(52) U.S. Cl. ............................ 341/61; 341/50; 348/485
(58) Field of Classification Search .................. 341/50, 341/60, 61; 348/485; 381/2
See application file for complete search history.

(56) References Cited

U.S. PATENT DOCUMENTS

| | | | | |
|---|---|---|---|---|
| 4,870,661 A | * | 9/1989 | Yamada et al. ............... | 375/240 |
| 6,233,287 B1 | * | 5/2001 | Kelley et al. ................ | 375/316 |
| 6,714,529 B1 | * | 3/2004 | Tanabe et al. ............... | 370/343 |
| 2005/0156645 A1 | * | 7/2005 | Hirano ....................... | 327/233 |
| 2006/0045212 A1 | * | 3/2006 | Ishii et al. .................... | 375/340 |
| 2006/0182209 A1 | * | 8/2006 | Coyne et al. ................ | 375/349 |

FOREIGN PATENT DOCUMENTS

JP 5-327409 12/1993

\* cited by examiner

*Primary Examiner*—Brian Young
(74) *Attorney, Agent, or Firm*—Studebaker & Brackett PC; Donald R. Studebaker

(57) ABSTRACT

A sampling rate converting circuit receives plural pieces of input data having different sampling frequencies. A plurality of FIR circuits is shared to reduce a circuit area, and, in a case where a magnification ratio of an input frequency and an output frequency is not an integer, signal deterioration due to resampling is solved. An oversampling component performs oversampling on input data Fs1 and outputs output data Fs'. An input timing timer calculates an input/input time based on an input timing signal CK1. An output timing timer and an accumulator calculate an input/output time based on an output timing signal CK' and the input timing signal CK1 and multiplies the input/output time by an oversampling multiple W to obtain a multiplied result. A divider divides the multiplied result by the input/input time to obtain a sampling position. A coefficient generator generates a filter coefficient based on the sampling position and supplies the filter coefficient to a multiplier.

16 Claims, 14 Drawing Sheets

RELATIONSHIP BETWEEN INPUT FREQUENCY AND FIR POSITION

X1 OVERSAMPLING
(Fs IS NOT CHANGED)

X2 OVERSAMPLING

X4 OVERSAMPLING

FILTER COEFFICIENT FOR OVERSAMPLING MULTIPLE W

X1 OVERSAMPLING
(Fs IS NOT CHANGED)

X2 OVERSAMPLING

X4 OVERSAMPLING

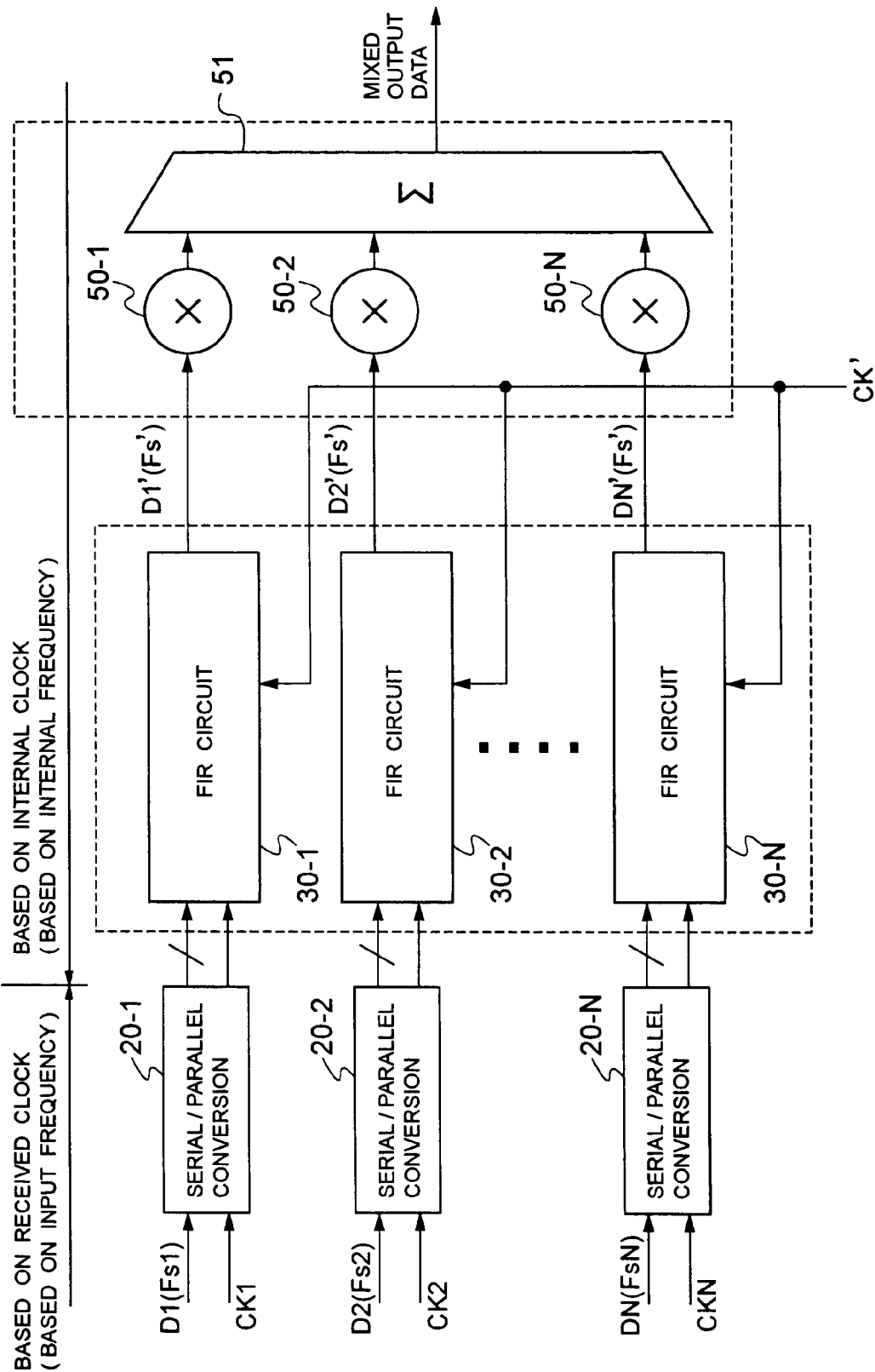

SAMPLING RATE CONVERTING METHOD AND CIRCUIT

BACKGROUND OF THE INVENTION

1. Technical Field

The present invention relates to a sampling rate converting method and circuit for converting data having different rates, which is input to a plurality of synchronous serial circuits of which transmission clock signals (hereinafter, referred to as "clock") are asynchronous, into a same sampling rate.

2. Description of the Related Art

For example, when two input digital audio (speech) signals having different sampling rates of 48 KHz and 32 KHz in broadcasting satellite are converted into an output digital audio signal having a sampling rate of 44.1 KHz to be recorded in a compact disc (CD), a sampling rate converting circuit for converting the two input digital audio signals (having the sampling rate of 48 KHz and 32 KHz) into one output digital audio signal (having the sampling rate of 44.1 KHz) is needed.

Conventionally, a sampling rate converting method or circuit is disclosed in Japanese Patent Kokai No. 5-327409 (Patent Document 1) and Japanese Patent Kokai No. 8-125493 (Patent Document 2).

In general, in 3-wired serial data communication of a digital audio signal, three signals including a clock clk, a channel signal ch, and data D(Fs) which is a digital audio signal are transmitted. A transmission master circuit (master circuit) outputs timing signals CK (clock clk and channel signal ch) and a reception slave circuit (slave circuit) receives the data D(Fs) and outputs D'(Fs') in synchronization with the clock clk. To this end, in the sampling rate converting circuit provided in the slave circuit, synchronization is performed by a reference signal (clock clk or input timing signal ck which is the channel signal ch) transmitted from the master circuit, multiply is, if necessary, performed by a phase-locked loop (PLL), and an operation portion is performed depending on the clock clk of the master circuit.

FIG. 1 shows a schematic configuration of a conventional sampling rate converting circuit.

The sampling rate converting circuit includes a serial/parallel converting circuit 1 for converting serial data into parallel data, a finite impulse response (FIR) circuit 10 for performing a FIR filter operation, and a resampling circuit 19.

Among an input timing signal CK1 and input data D1(Fs1) which is a digital audio signal having any sampling frequency Fs1 transmitted from the master circuit, the input data D1(Fs1) is converted into the parallel data by the serial/parallel converting circuit 1 and the parallel data is subjected to a filter process (oversampling) by the FIR circuit 10. The oversampled data is resampled based on an output timing signal CK' by the resampling circuit 19 and output as output data D1'(Fs') which is a digital audio signal.

In paragraphs 0014 and 0016 to 0018 and FIG. 1 of Patent Document 1, there is disclosed a technology of performing a FIR operation at points of times t3 and t4 among points of times t1 to t4 obtained by quartering a period of a first clock P21 synchronized with input data which is a digital audio signal before sampling rate conversion, based on a second clock P27 synchronized with output data which is a digital audio signal after the sampling rate conversion and reducing a multiplication coefficient applied to a FIR digital filter, in a FIR digital filter for performing oversampling.

In addition, in claim 1 and paragraphs 0045 and 0046 of Patent Document 2, there is disclosed a technology of applying f2/k multiple oversampling to first sampling data and extracting data from each of f1/k sets of data based on the oversampled result when a prescribed integer k is selected so that f1/k and f2/k are both integers, thereby suppressing signal level error from increasing, obtaining output data with high precision, and simplifying a circuit configuration, in a sampling rate converter that provides an output of an input signal sampled by a first sampling frequency f1 as a signal with a second sampling frequency f2.

However, in the conventional sampling rate converting circuit or method shown in FIG. 1, since the input of the input data D1(Fs1) and the output of the output data D1'(Fs') should be controlled depending on the master circuit operation clock clk transmitted from the transmission master circuit, the FIR circuit 10 should be operated based on the clock clk. To this end, following problems (A) and (B) are caused.

(A) A case where plural pieces of input data having different sampling frequencies are input FIG. 2 shows a schematic configuration when mixing plural pieces of input data having different sampling frequencies using the conventional method shown in FIG. 1.

When processing plural pieces (N) of input data having different sampling frequencies [input data D1(Fs1) having a sampling frequency Fs1 (for example, 48 KHz), input data D2(Fs2) having a sampling frequency Fs2 (for example, 32 KHz), . . . , and input data DN having a sampling frequency FsN] transmitted from the slave circuit, N sampling rate converting circuits shown in FIG. 2 are generally required. The N sampling rate converting circuits include serial/parallel converting circuits 1-1, 1-2, . . . , and 1-N for receiving the input data D1(Fs1), D2(Fs2), . . . , and DN(FsN) and input timing signals CK1, CK2, . . . , and CKN, FIR circuits 10-1 to 10-N, and resampling circuits 19-1 to 19-N for outputting output data D1'(Fs'), D2'(Fs'), . . . and DN'(Fs') based on a common output timing signal CK'.

Since the FIR circuits 10-1 to 10-N provided in the sampling rate converting circuits perform operations on the plural pieces of input data D1(Fs1), D2(Fs2), . . . , and DN(FsN) which are asynchronously input, that is, perform oversampling of the input data D1(Fs1), D2(Fs2), . . . , and DN(FsN) having different sampling frequencies Fs1, Fs2, and FsN, times required for the FIR operations on the input data D1(Fs1), D2(Fs2), . . . , and DN(FsN) are different from one another. To this end, it is difficult to provide a common FIR circuit 10 instead of the plurality of FIR circuits 10-1 to 10-N and to perform the operations on the input data D1(Fs1), D2(Fs2), . . . , and DN(FsN) in a time division fashion. Accordingly, it is difficult to unify (share) the plurality of FIR circuits 10-1 to 10-N to reduce a circuit area.

(B) A case where a magnification ratio of an input frequency and an output frequency is not an integer FIG. 3 shows an example of a conventional oversampling method in the sampling rate converting circuit shown in FIG. 1. In FIG. 3, for example, a configuration of oversampling a sampling frequency Fs (before conversion) to 2(n+1) times using the FIR circuit 10 shown in FIG. 1 is shown. The FIR circuit 10 for oversampling includes a high-order FIR filter, n low-order FIR filters [or infinite impulse response (IIR) filter]. In the FIR circuit 10, the sampling frequency Fs of input data X1, X2, X3, . . . is oversampled to output data of a sampling frequency $(2^{(n+1)})Fs$. This data is resampled based on an output timing signal CK' (sampling frequency Fs') by the resampling circuit 19 and output data Y1, Y2, . . . are output.

FIG. 4 shows an example of resampling after oversampling using the conventional method shown in FIG. 3. In FIG. 4, abscissa represents a time and ordinate represents an amplitude. In addition, oversampling wavelengths of x2, x4, x8 of the input data X1, X2, X3 and wavelengths of output data Y1 and Y2 are shown.

FIGS. 5A and 5B show a relationship between an input frequency and a FIR position (sampling position), where FIG. 5A shows a case where the output frequency is higher than the input frequency and FIG. 5B shows a case where the output frequency is lower than the input frequency.

SUMMARY OF THE INVENTION

When the magnification ratio of the input frequency and the output frequency is not the integer, a signal deteriorates by resampling for the following reasons.

As shown in FIG. 3, the sampling rate conversion is realized by oversampling the sampling frequency Fs of the input data X1, X2, X3, ... to several times $(2^{(n+1)})$Fs and resampling the oversampled frequency to the output sampling frequency Fs'. However, in this method, the sampling frequency conversion of an integral multiple does not cause a problem, but when the magnification ratio of the input frequency and the output frequency is not the integer, frequency deviation occurs to generate loopback noise. To this end, high-magnification oversampling need be performed.

In the conventional circuit configuration shown in FIG. 3, research into using a combination of a plurality of filters as the filter portion 10 for oversampling was conducted. However, since all the points are operated as shown by eight-times oversampling wavelength of in FIG. 4, the high magnification is restricted and signal deterioration due to the resampling cannot be solved.

A sampling rate converting method (or circuit) according to the present invention includes an oversampling step (or component), an input/input time calculating step (or component), a multiplied result calculating step (or component), a dividing step (or component), and a coefficient generating step (or component).

The oversampling step (or component) stores input data among the input data and an input timing signal synchronized with the input data in a memory, multiplies the data stored in the memory by a filter coefficient to obtain a first multiplied result, accumulates the first multiplied result to obtain the accumulated result, stores the accumulated result in the memory again, and externally outputs the accumulated result, in which the frequency of the input data is oversampled, as output data.

The input/input time calculating step (or component) calculates an input/input time, which is an interval of the input timing signal, based on the input timing signal. The multiplied result calculating step (or component) calculates an input/output time from an input of the input timing signal to an output of the output timing signal based on the output timing signal and the input timing signal of the output data and multiplies the input/output time by an oversampling multiple to obtain a second multiplied result. The dividing step (component) divides the second multiplied result by the input/input time to obtain a sampling position. The coefficient generating step (or component) generates the filter coefficient based on the sampling position and supplies the filter coefficient to the oversampling step (or component).

In the other sampling rate converting method (or circuit) according to the present invention, the sampling rate conversion is performed in a time division fashion when the plural pieces of input data and the plurality of input timing signals synchronized with the input data are input.

According to a first aspect of the present invention, by increasing the internal clock and the coefficient generating step (or component), it is possible to easily increase the oversampling magnification ratio and to improve the filter performance such as the S/N ratio without increasing the operation by interpolation of 0 due to FIR. In addition, even in the operation precision of the filter operation, by speeding up the internal clock, it is possible to easily apply a method of simplifying the operation by the interpolation of 0 due to FIR, to improve resolution of a time axis, and to sufficiently ensure the filter performance. According to the speeding-up of the internal clock, the oversampling magnification ratio of the FIR operation increases and the filter coefficient increases. Since the coefficient generating step (or component) can be realized by the table such as ROM, a plurality of synchronous serial signals can be resampled by one circuit and an effect is obtained in view of the circuit area.

According to another aspect of the present invention, since the time of the input timing signal of the input data is measured by an input timing timer and an output timing timer and the ratio of the input timing signal and the output timing signal is calculated by an operation, a filter operation depends on the input frequency (interval of the input timing signal) and the data signal having any input frequency can be easily resampled to a signal having a specific output frequency.

According to a further aspect of the present invention, since the multiplied result calculating step (or component) is realized by an accumulator, an adder, and a first selector and the dividing step (or component) is realized by the subtractor and the counter, it is possible to reduce a circuit scale.

According to a still further aspect of the present invention, since a second subtractor and a second selector are further included, the present invention is applicable to downsampling.

According to a yet further aspect of the present invention, since a process depends on the output timing signal, the filter operation on the input data can become uniform and a time-division process can be easily performed. Accordingly, plural pieces of data can be input by a single filter circuit.

BRIEF DESCRIPTION OF THE DRAWINGS

FIG. 12 shows a configuration of a plurality of input mixings using the method of the first embodiment;

DESCRIPTION OF EXEMPLARY EMBODIMENTS

A sampling rate converting circuit according to the present invention includes an oversampling component, an input/input time calculating component, a multiplied result calculating component, a dividing component, and a coefficient generating component. The oversampling component stores input data among the input data and an input timing signal synchronized with the input data in a memory, multiplies the data stored in the memory by a filter coefficient to obtain a first multiplied result, accumulates the first multiplied result to obtain the accumulated result, stores the accumulated result in the memory again, and externally outputs the accumulated result, in which the frequency of the input data is oversampled, as output data.

The input/input time calculating component calculates an input/input time, which is an interval of the input timing signal, based on the input timing signal. The multiplied result calculating component calculates an input/output time from an input of the input timing signal to an output of the output timing signal based on the output timing signal and the input timing signal of the output data and multiplies the input/output time by an oversampling multiple to obtain a second multiplied result. The dividing component divides the second multiplied result by the input/input time to obtain a sampling position. The coefficient generating component generates the filter coefficient based on the sampling position and supplies the filter coefficient to the oversampling component.

For example, the input/input time calculating component includes an input timing timer which times the input timing signal to obtain the input/input time which is the interval of the input timing signal. The multiplied result calculating component includes an output timing timer which times the input/output time and a multiplier which obtains the second multiplied result.

Basic Configuration

Figure 6:
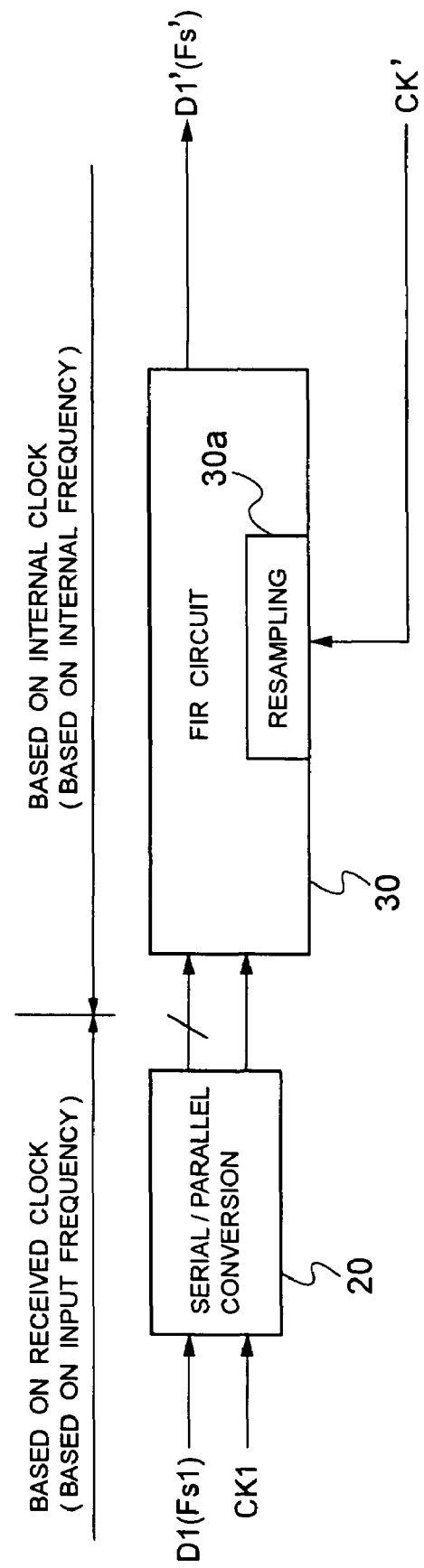
FIG. 6 shows a basic configuration of a sampling rate converting circuit according the present invention.

FIG. 6 shows a basic configuration of a sampling rate converting circuit according the present invention. The sampling rate converting circuit is provided in a reception slave circuit, and includes a serial/parallel converting circuit 20 for converting serial input data D1(Fs1) among the serial input data D1(Fs1) and an input timing signal CK1 transmitted from a transmission master circuit into parallel data and a FIR circuit 30 for performing a filter operation based on the parallel data and outputting output data D1'(Fs'). In the FIR circuit 30, a resampling component 30a for performing a resampling operation based on the output timing signal CK'.

For example, the input data D1(Fs1) of FIG. 6 is a digital audio signal having any sampling frequency Fs1 transmitted from the master circuit (before conversion). The input timing signal CK1 is a clock clk or a channel signal ch transmitted from the master circuit in synchronization with the input data D1(Fs1). The output data D1'(Fs') is a digital audio signal of a resampling frequency Fs' after conversion. The output timing signal CK' is a clock (that is, an operation clock in the slave circuit) synchronized with the output data D1'(Fs').

Figure 1:
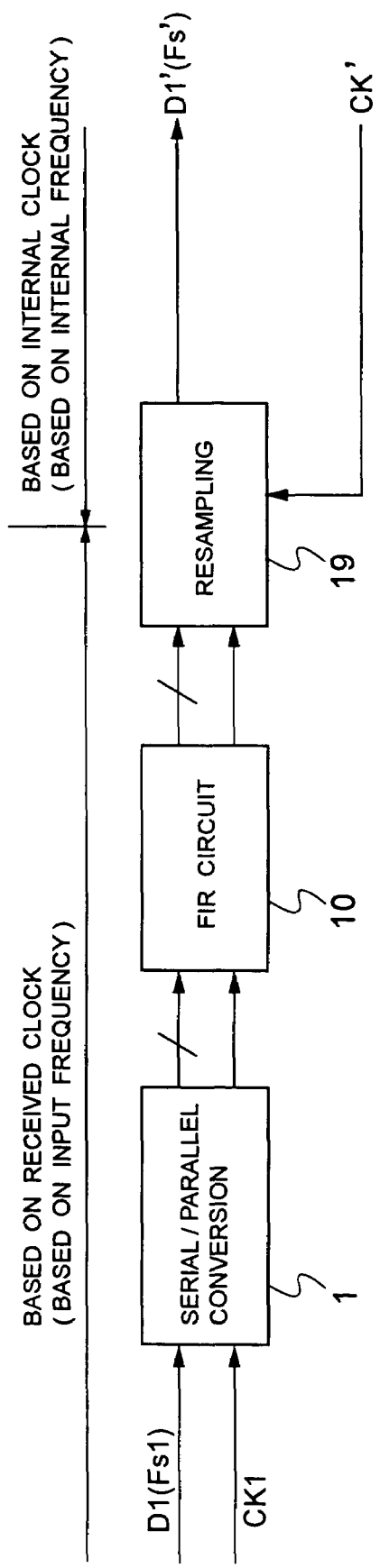
FIG. 1 shows a schematic configuration of a conventional sampling rate converting circuit.

In the conventional rate converting circuit shown in FIG. 1, the FIR circuit 10 performs the filter operation based on the input timing signal CK1 used for synchronous serial transmission. In contrast, in the sampling rate converting circuit according to the present invention, the serial input data D1(Fs1) among the serial input data D1(Fs1) and the input timing signal CK1 transmitted from a master circuit is converted into the parallel data in the serial/parallel converting circuit 20, an oversampling portion and a resampling portion after serial/parallel conversion are configured by one FIR circuit 30, and the FIR circuit 30 performs the filter operation on an output frequency after resampling using the resampling component 30a, based on an internal clock CK1' (internal frequency).

Since the filter operation is performed based on the output frequency after resampling, for example, plural pieces of data can be input by a single filter circuit and mixing or process of a digital amplifier can be easily realized by the same circuit.

Figure 7:
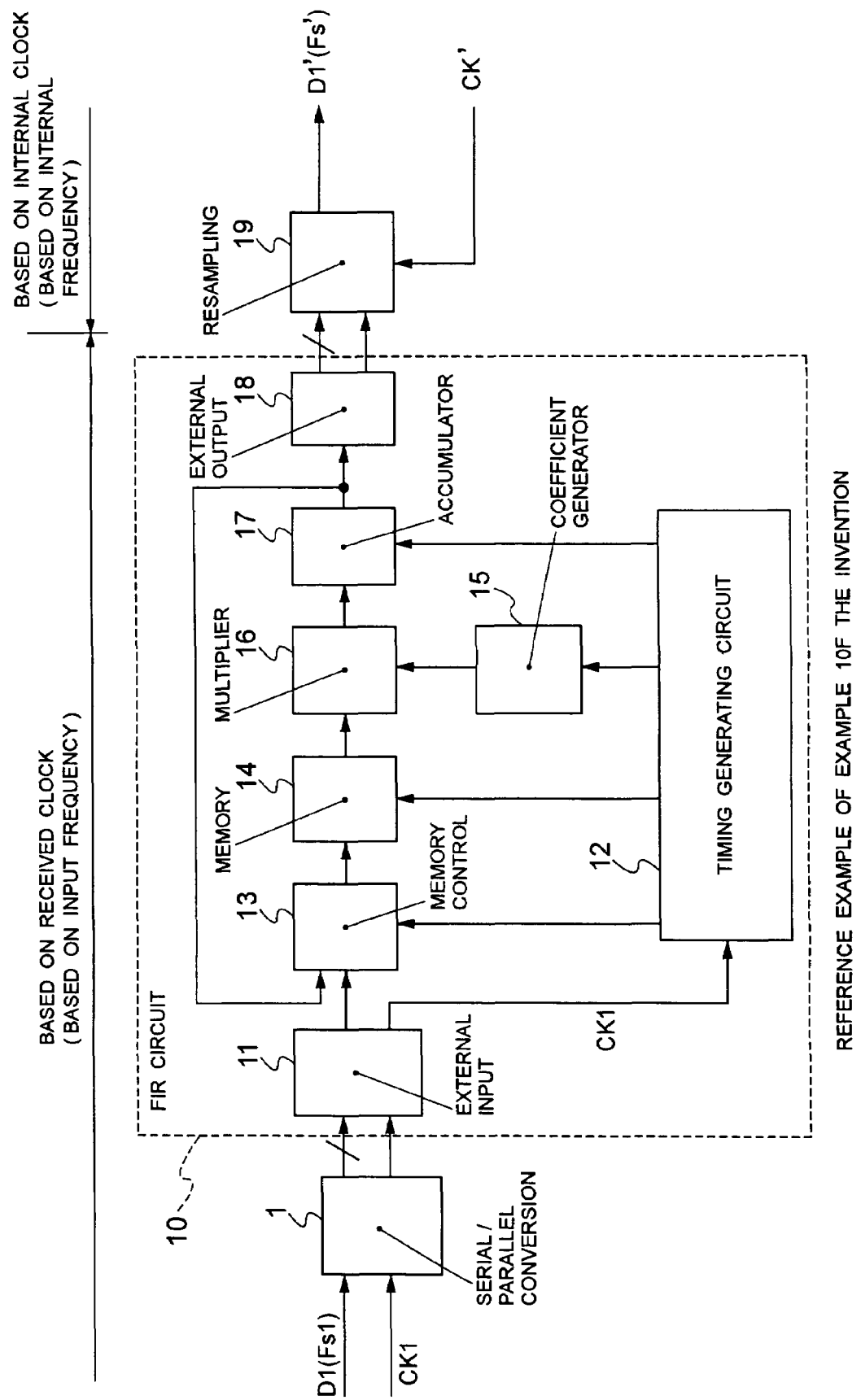
FIG. 7 shows a configuration of a sampling rate converting circuit of a reference example of a first embodiment for realizing a sampling rate converting circuit according to the present invention.

FIG. 7 shows a configuration of a sampling rate converting circuit showing a reference example of a first embodiment for realizing the sampling rate converting circuit according to the present invention.

The sampling rate converting circuit shown in FIG. 7 is a reference example showing the conventional configuration of FIG. 1 in order to clarify characteristics of the first embodiment.

In the reference example, the FIR circuit 10 shown in FIG. 1 is configured as follows. In other words, the FIR circuit 10 includes an external input circuit 11 for receiving an output signal of a serial/parallel converting circuit 1, a timing generating circuit 12 for generating various internal timing signals for control from an output signal of the external input circuit 11, a memory control circuit 13 for controlling a memory 14 based on the output of the external input circuit 11 and the internal timing signal, the memory 14 for storing data, a coefficient generator 15 for generating a filter coefficient, which is a multiplication coefficient, based on a uniform arithmetic sequence signal output from the timing generating circuit 12, a multiplier 16 for multiplying the filter coefficient by output data of the memory 14, an accumulator 17 for accumulating the multiplied result of the multiplier 16 based on the internal timing signal, and an external output circuit 18 for outputting the accumulated result of the accumulator 17 to a resampling circuit 19.

In such a configuration, the serial input data D1(Fs1) transmitted from the transmission master circuit to the reception slave circuit is converted into the parallel data to become data and input timing signal CK1, both of which are input to the FIR circuit 10 through the external input circuit 11. The input timing circuit CK1 is input to the timing generating circuit 12 and various internal timing signals for controlling operation timings are generated by the timing generating circuit 12. The data input from the external input circuit 11 is subjected to a product-sum operation and a filter process such as oversampling by the memory 14, the multiplier 16, and the accumulator 17, all of which are included in the filter circuit, through the memory control circuit 13.

When mixing or multi-stage filter processes on the data after the filter process is performed, the data returns to the memory control circuit 13, and, when the data is externally output, shaping of an operation bit number is performed by the external output circuit 18 and the output data of the external output circuit 18 is output to the resampling circuit 19. In the resampling circuit 19, resampling on the output data of the external output circuit 18 is performed based on the external output timing signal CK' to output the output data D1'(Fs').

Configuration of the First Embodiment

Figure 8:
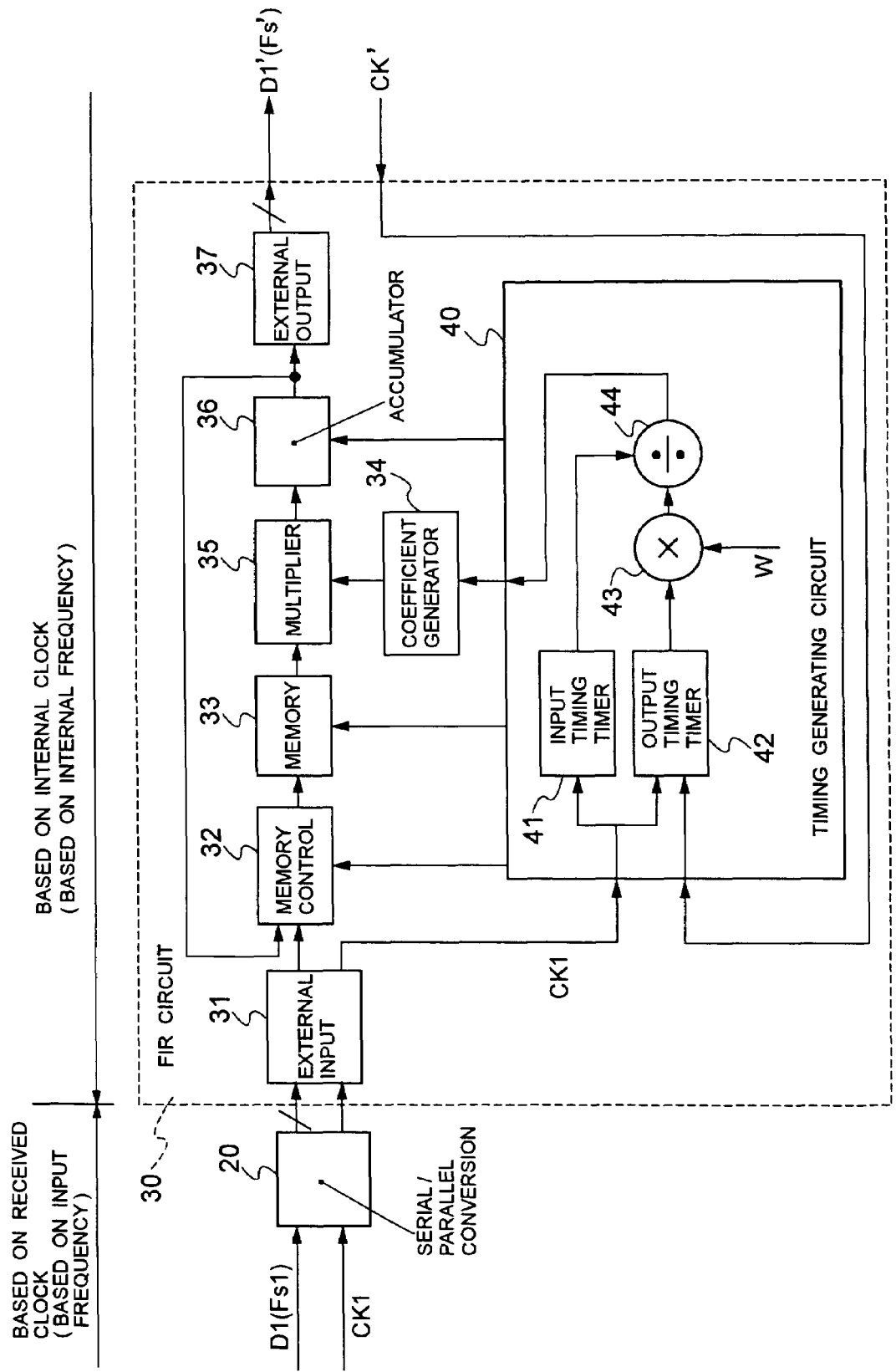
FIG. 8 shows a configuration of the sampling rate converting circuit according to the first embodiment of the present invention.

FIG. 8 shows a configuration of the sampling rate converting circuit according to the first embodiment of the present invention, which embodies the basic configuration of FIG. 6.

Figure 3:
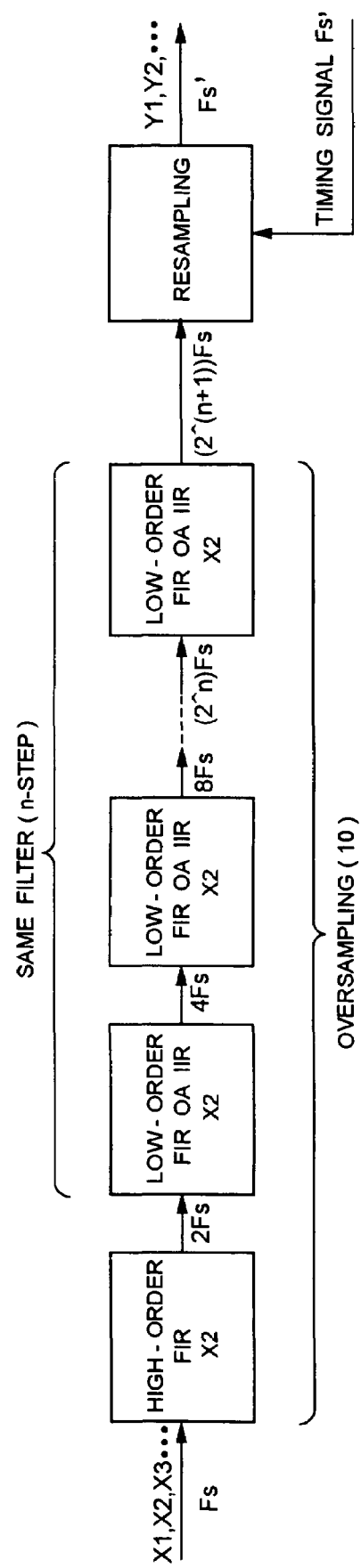
FIG. 3 shows an example of a conventional oversampling method in the sampling rate converting circuit shown in FIG. 1.

The sampling rate converting circuit according to the first embodiment is provided in the reception slave circuit, and includes the serial/parallel converting circuit 20 for converting the serial input data D1(Fs1) among the serial input data D1(Fs1) and the input timing signal CK1 transmitted from the transmission master circuit into the parallel data and the FIR circuit 30 connected to the output side of the serial/parallel converting circuit 20. The first embodiment is different from the reference example of FIG. 3 in that the FIR circuit 30 is provided instead of the FIR circuit 10 and the resampling circuit 19 of the reference example, and more particular, a timing generating circuit 40 corresponding to the resampling circuit 19 and the timing generating circuit 12 of the reference example is provided in the FIR circuit 30. The timing generating circuit 40 corresponds to the resampling component 30a of FIG. 6 and is a calculating portion for generating a multiplication filter coefficient.

In other words, the FIR circuit 30 of the first embodiment includes a filer unit which is an oversampling component composed of an external input circuit 31 used for a general filter operation, a memory control circuit 32, a memory 33, a coefficient generating component (for example, coefficient generator) 34 composed of a table such as a read only memory (hereinafter, referred to as "ROM"), a multiplier 35, an accumulator 36, and an external output circuit 37, and the timing generating circuit 40 which is a characteristic portion of the first embodiment.

In the filter unit, the external output circuit 31 receives the parallel data and the input timing signal CK1 output from the serial/parallel converting circuit 20 and writes the parallel data in the memory 33 through the memory control circuit 32. A multiplier output from the memory 33 and a multiplicand of the filter coefficient output from the coefficient generator 34 are multiplied by the multiplier 35, and the multiplied result is accumulated by the accumulator 36. The accumulated result is feedback-input to the memory control circuit 32 to be used for the operation again and input to the external output circuit 37 to perform output shaping of a bit width. The external output circuit 37 shapes the accumulated result to output the output data D1'(Fs') to an external module.

The timing generating circuit 40 includes an input/input time calculating component (for example, an input timing timer) 41, a multiplied result calculating component (for example, an output timing timer 42 and a multiplier 43), and a dividing component (for example, a divider) 44. The input timing signal CK1 from the external input circuit 31 is input to the input timing timer 41 and the output timing timer 42 and the external output timing signal CK' is input to the output timing timer 41. The input timing timer 41 counts the input timing signal from the external input circuit 31 and outputs an input/input time, and the output side thereof is connected to the divider 44. The output timing timer 42 performs a count operation based on the input timing signal CK1 from the external input circuit 31 and the output timing signal CK' and outputs an input/output time, and the output side thereof is connected to the multiplier 43.

The multiplier 43 performs multiplication using the input/output time from the output timing timer 42 as the multiplicand and an oversampling multiple as the multiplier W and supplies the multiplied result to the divider 44. The divider 44 performs division using the multiplied result as a dividend and the input/input time from the input timing timer 41 as a divisor and supplies the divided result to the coefficient generator 34 as a FIR position. The coefficient generator 34 generates a filter coefficient, which is the multiplication coefficient, based on the input FIR position and supplies the filter coefficient to the multiplier 35.

Sampling Rate Converting Method of the First Embodiment

The sampling rate converting method of FIG. 8 will be described. The serial input data D1(Fs1) among the serial input data D1(Fs1) and the input timing signal CK1 transmitted from the transmission master circuit to the reception slave circuit is converted into the parallel data by the serial/parallel converting circuit 20 to become data and input timing signal CK1, both of which are input to the FIR circuit 30 through the external input circuit 31. The input data is subjected to a product-sum operation and a filer process by the memory 33, the multiplier 35, and the accumulator 36 through the memory control circuit 32 configuring the filer unit. When mixing or multi-stage filter processes on the data after the filter process is performed, the data returns to the memory control circuit 32, and, when the data is externally output, shaping of an operation bit number is performed by the external output circuit 37 and the output data D1'(Fs') is output to a next-stage circuit. The control of the operation timing is performed by the timing generating circuit 40 and is similar to the method of the reference example of FIG. 7.

The first embodiment is characterized in that the output timing signal CK' for output request from the external circuit is input to the timing generating circuit 40 and the input timing signal CK1 from the external input circuit 31 is used such that the input/output time from the input to the output is calculated by the output timing timer 42. The input/input time, which is an interval of the input timing signal CK1, is calculated by the input timing timer 41, values of the input/output time and the input/input time are multiplied and divided by the multiplier 43 and the divider 44, and the FIR position is calculated by the conventional method in order to perform the FIR operation on only a value necessary for resampling. This scheme is shown in FIG. 9.

Figure 9:
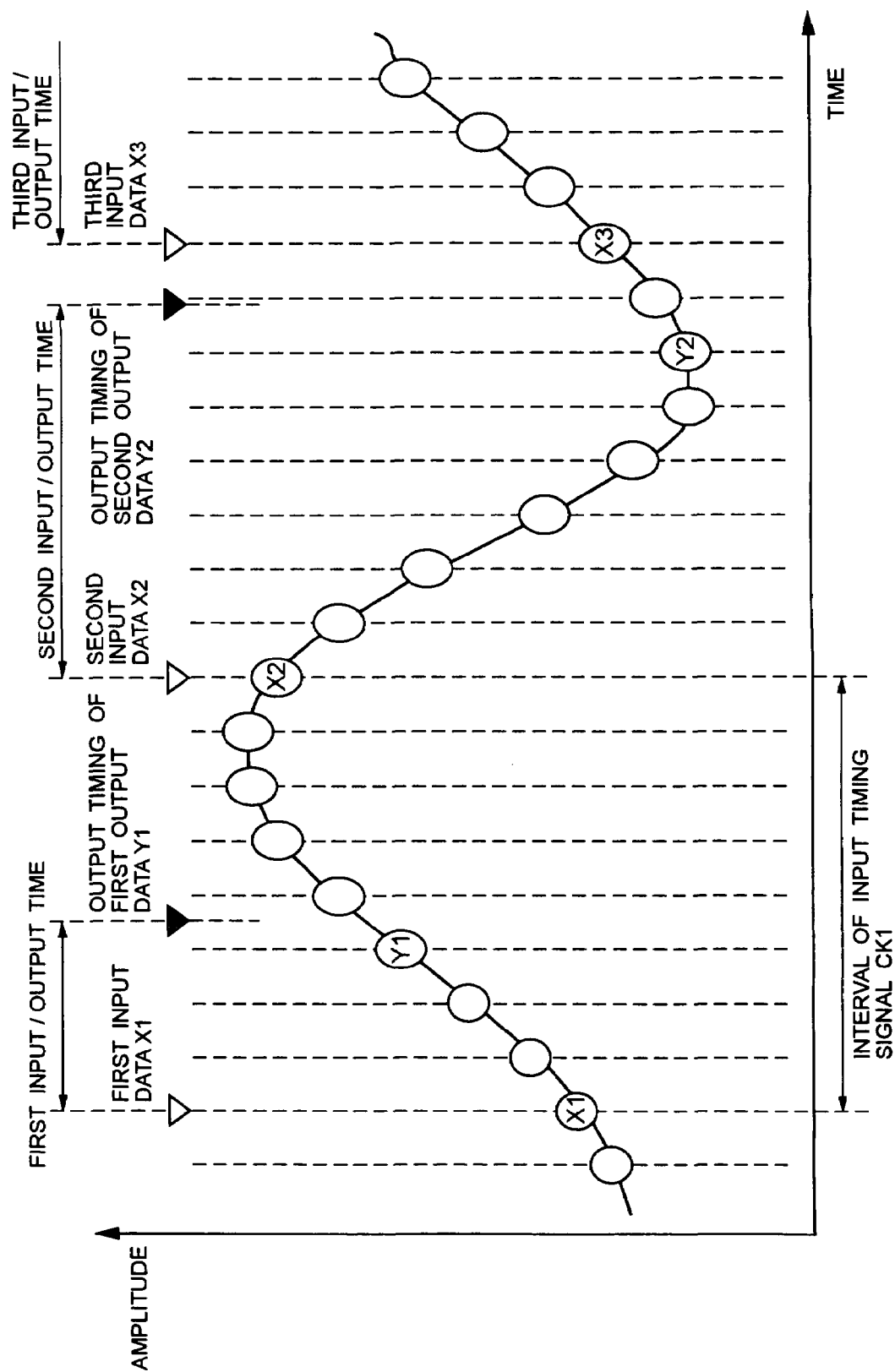
FIG. 9 is a view showing an asynchronous sampling rate converting circuit using eight-times oversampling.

FIG. 9 is a view showing an asynchronous sampling rate converting circuit using eight-times oversampling. In FIG. 9, the interval of the input timing signal CK1 is the input/input time and, for example, corresponds to a period of the input timing signal CK1. Y1 and Y2 denote output data of sampling (position) according to the rate after conversion. In addition, when the oversampling is actually performed, in order to obtain performance such as a signal/noise ratio (S/N ratio), high-magnification oversampling need be performed.

Figure 4:
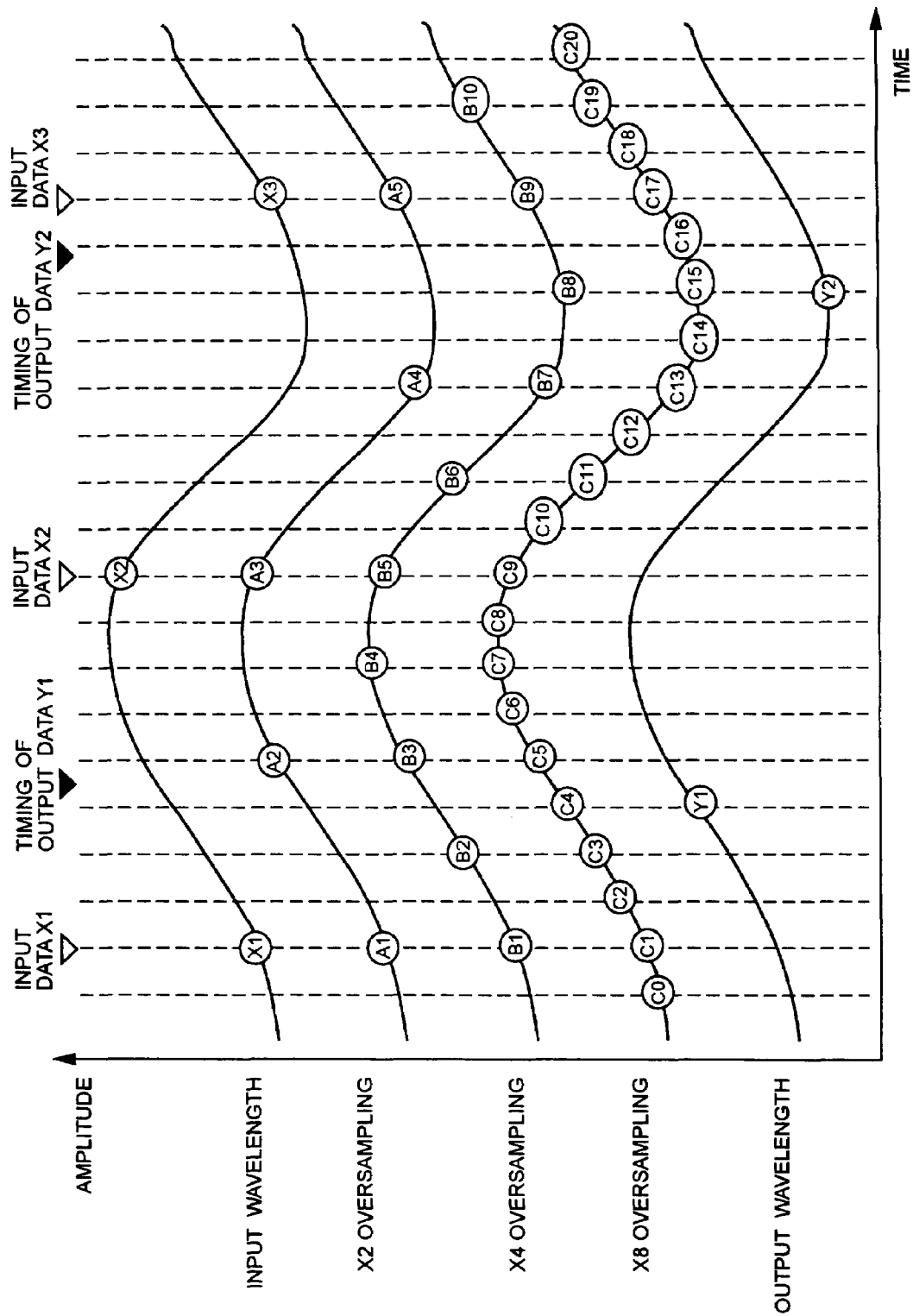
FIG. 4 shows an example of resampling after oversampling using the conventional method shown in FIG. 3.
Figure 5A:
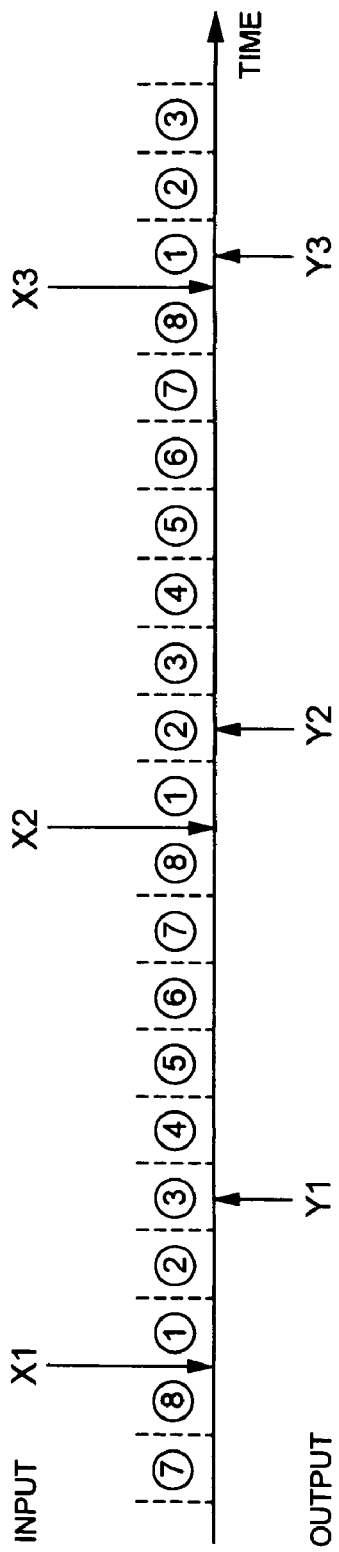
FIGS. 5A and 5B show a relationship between an input frequency and a FIR position (sampling position)
Figure 5B:
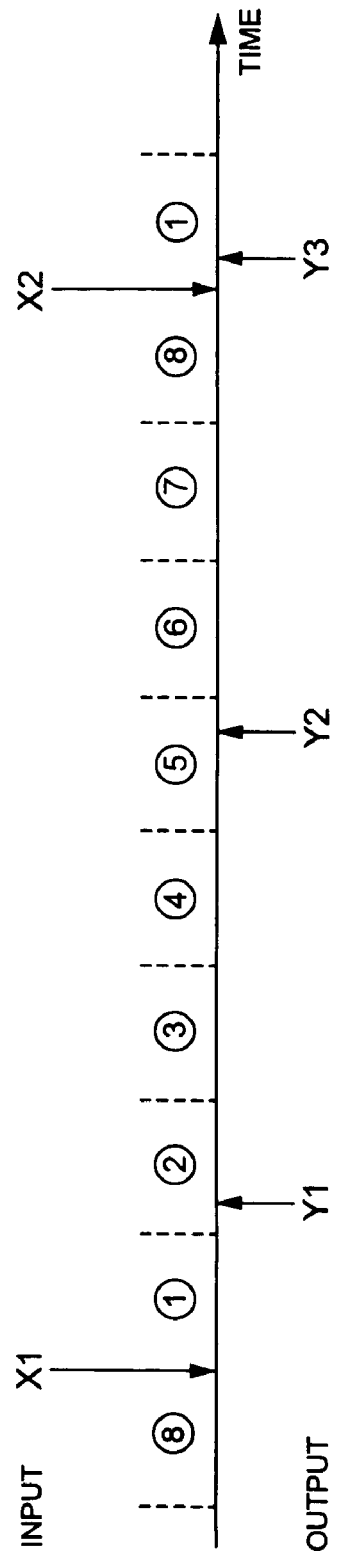

When the input data D1(Fs1) is converted into the parallel data X1, X2, . . . by the serial/parallel converting circuit 20 and input to the FIR circuit 30 through the external input circuit 31, each of the data X1, X2 . . . should be oversampled to obtain eight-times data which are, for example, indicated by white circles and circled characters between the interval of the input timing signals CK1 in FIG. 9. However, when the whole operation result need not be used in the next stage (in this example, when the output frequency is less than eight times, like the output data Y1 and Y2), only necessary timings (only the output data Y1 and Y2) can be calculated to simplify the operation. In addition, in the conventional operation, a method of doubly increasing the input wavelength in sequence is often used, as shown in FIG. 4.

In the first embodiment, in order to obtain the position requiring the FIR operation, the following calculation is needed.

$$FIR\ position = (input/input\ time) - [(input/output\ time) \times (oversampling\ multiple\ W)]$$

In FIG. 9, several FIR positions are calculated with respect to a first input/output time, a second input/output time, ... and an oversampling coefficient which is a filter coefficient is calculated by the coefficient generator 34 based on the FIR positions.

In the timing generating circuit 40 which is the filter coefficient calculating portion, examples of changing only the oversampling magnification ratio under the condition the sampling frequency of the input signal and a cutoff frequency of the filter are uniform when the FIR filter performs the oversampling are shown in FIGS. 10A to 10C and FIGS. 11A to 11C.

Figure 10A:
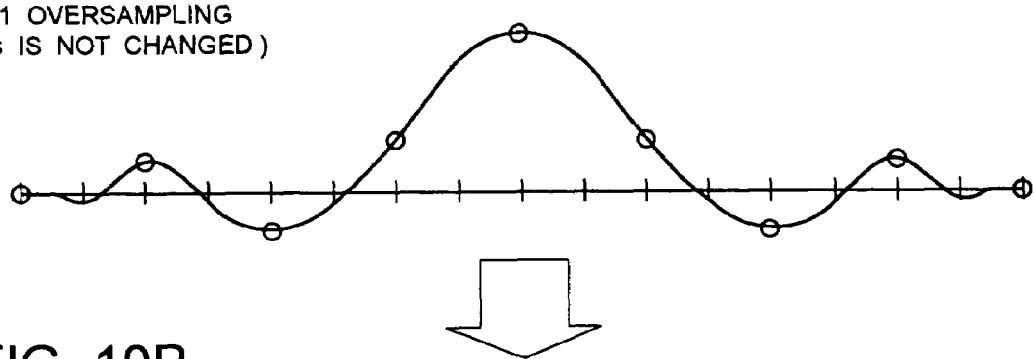
FIGS. 10A to 10C show filter coefficients for an oversampling multiple W.
Figure 10B:
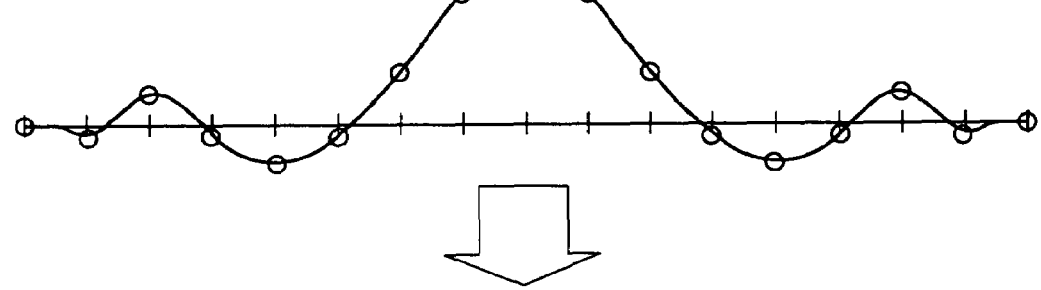
Figure 10C:
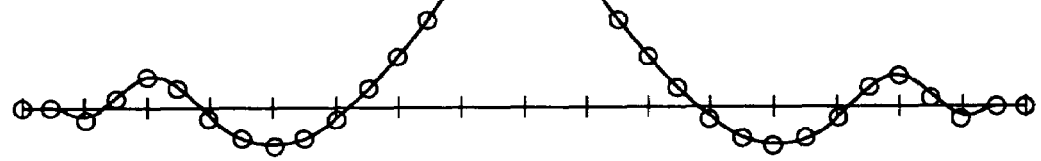
Figure 11A:
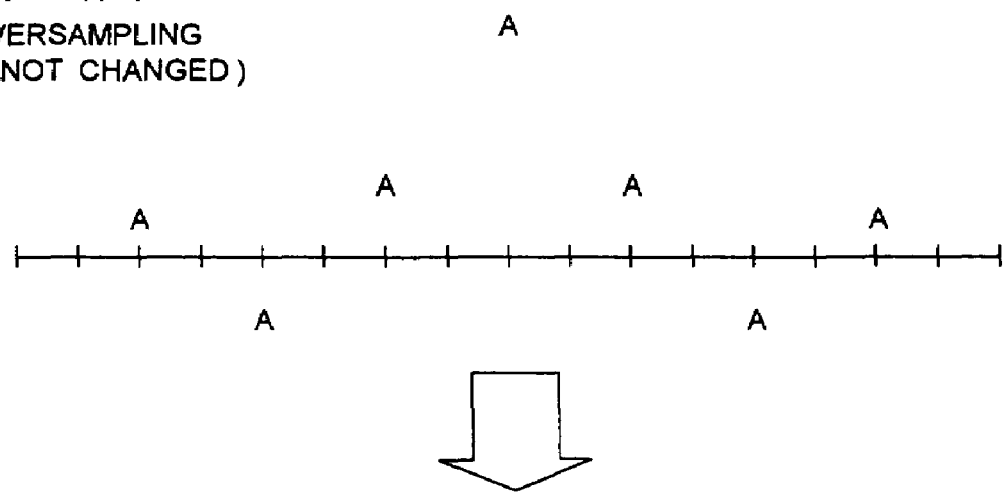
FIGS. 11A to 11C show filter coefficients for the oversampling multiple W and an operation point.
Figure 11B:
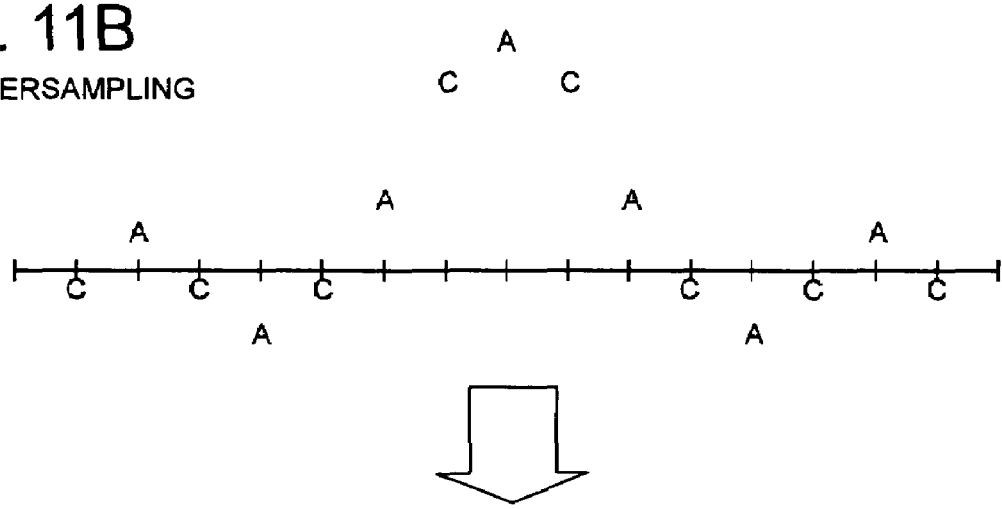
Figure 11C:
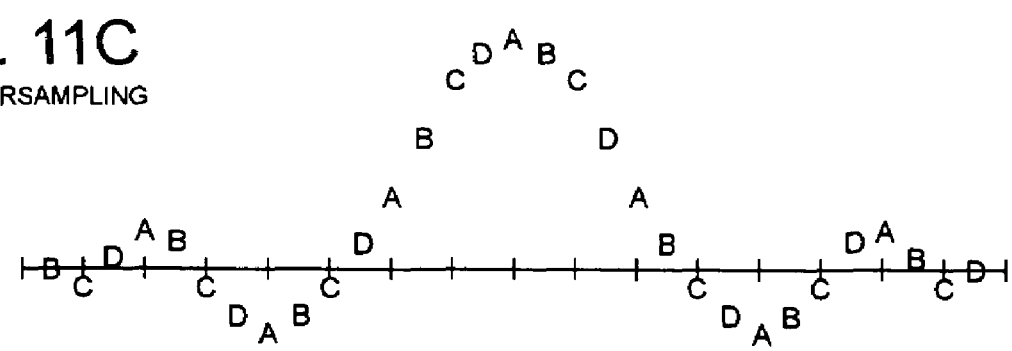

FIGS. 10A to 10C show filter coefficients for an oversampling multiple W, where FIG. 10A shows an example where the magnification ratio is one, FIG. 10B shows an example where the magnification ratio is two, and FIG. 10C shows an example where the magnification ratio is four. FIG. 11A to 11C shows filter coefficients and operation points for the oversampling multiple W in correspondence with FIGS. 10A to 10C, where FIG. 11A shows an example where the magnification ratio is one, FIG. 11B shows an example where the magnification ratio is two, and FIG. 11C shows an example where the magnification ratio is four.

In the conditions of FIGS. 10A to 10C, the loci of the filter coefficient are equal to one another and the number of the operations (number of portions marked with O) increases or decreases depending on the magnification ratio. However, when the sampling frequency of the input data is uniform, since a value of 0 is interpolated into the input data depending on the oversampling multiple W, the multiplied result becomes 0 and thus the operation need not be performed.

To this end, in an actual operation, as shown in FIGS. 11A to 11C, the FIR operation of one sample can be performed only by performing sum operations after multiplication of "A" in a one time of FIG. 11A,
any one of "A" and "C" in two times of FIG. 11B, and
any one of "A", "B", "C", and "D" in four times of FIG. 1C.

Accordingly, the number of the operations is uniform without depending on the oversampling magnification ratio. Thus, by increasing a clock frequency which is a resolution of the timing generating circuit 40, it is possible to increase the oversampling magnification ratio by increasing the table of the filter coefficient configuring the coefficient generator 34 and to improve filter performance in a state that the number of the operations is uniform.

Effect of the First Embodiment

The first embodiment has the following effects (1) to (3).

(1) In FIGS. 8 and 6, one synchronous serial communication is described as an example. In contrast, a method of realizing a plurality of synchronous serial communications is shown in FIG. 12.

FIG. 12 shows a configuration of a plurality of input mixings using the method of the first embodiment.

In this configuration, a plurality of serial/parallel converting circuits 20-1 to 20-N for receiving plural pieces of input data D1(Fs1), D2(Fs2), and DN(FsN) and input mixing signals CK1, CK2, ..., and CKN, a plurality of FIR circuits 30-1 to 30-N connected to the output sides of the plurality of serial/parallel converting circuit for outputting output data D1'(Fs'), D2'(Fs'), ..., and DN'(Fs'), a plurality of digital amplifiers 50-1 to 50-N connected to the output sides of the plurality of FIR circuits for digitally amplifying D1'(Fs'), D2'(Fs'), ..., and DN'(Fs'), and an adder 51 for adding output data of the digital amplifiers 50-1 to 50-N and outputting mixed output data are included. In oversampling shown in FIG. 9, the interval of the input timing signal (that is, input/input time) corresponds to the period of the input timing signal CK1 and the timing signal of FIG. 9 is also input to the other FIR circuits 10-2, ..., and 10-N.

The plurality of FIR circuits 30-1 to 30-N of FIG. 12 is composed of a signal FIR circuit. The plurality of FIR circuits 30-1 to 30-N is shown because the single FIR circuit performs the FIR operation of the input data D1, D2, ..., and DN in a time division fashion. Since only the FIR position necessary for sampling according to the rate after conversion is calculated, a time required for the FIR operation on the input data D1, D2, ..., and DN becomes uniform. Accordingly, the FIR circuits 30-1 to 30-N can become a unified circuit using a time division fashion by the same output timing signal CK', that is, the time-division FIR operation can be performed by the single FIR circuit. In addition, mixing with the plurality of digital amplifiers 50-1 to 50-N can be realized by the multiplier 43 and the divider 44 of the single FIR circuit (respective FIR circuits 30-1 to 30-N). At this time, the adder 51 is unnecessary.

Figure 2:
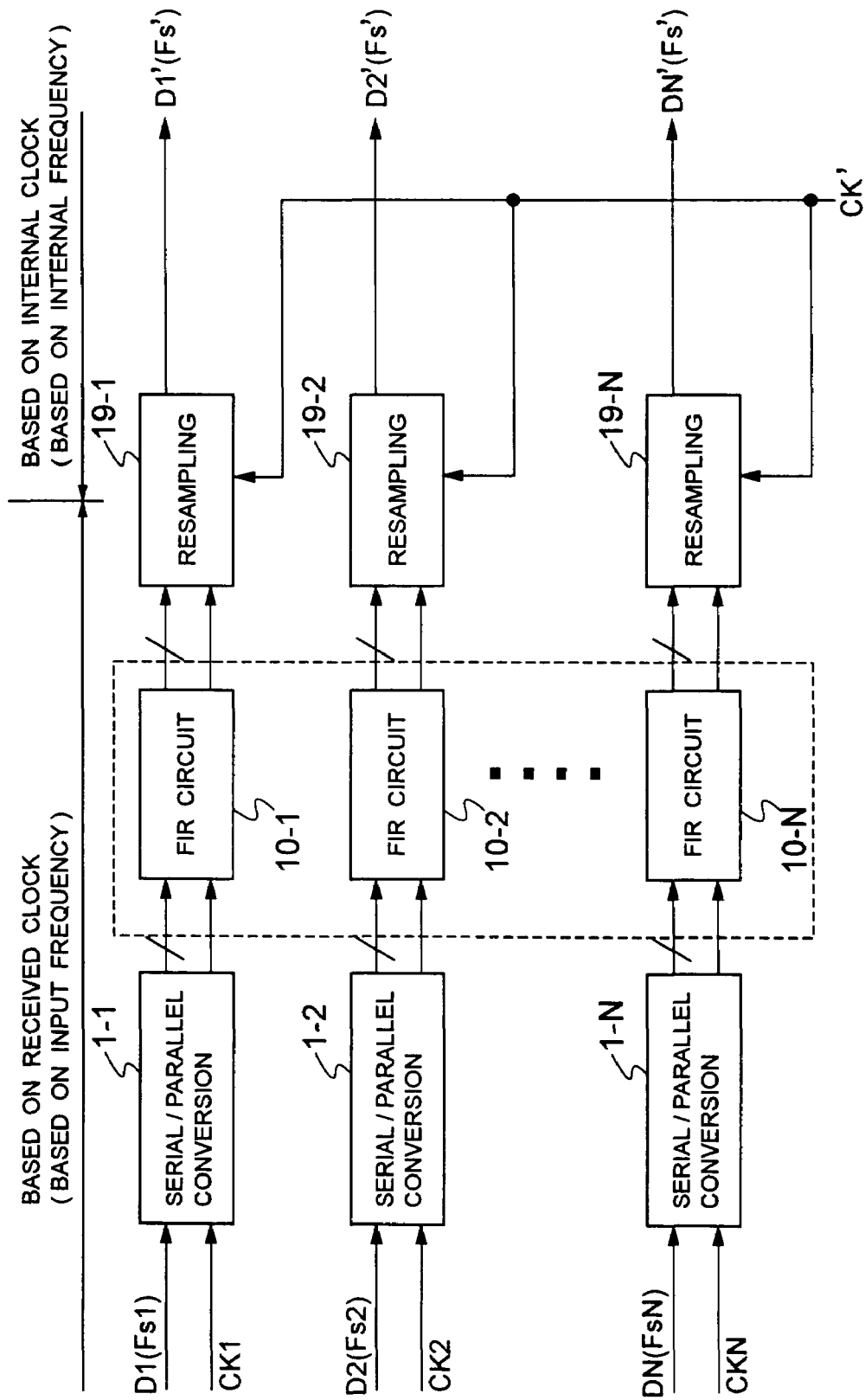
FIG. 2 shows a schematic configuration when mixing plural pieces of input data having different sampling frequencies using the conventional method shown in FIG. 1.

Since the serial/parallel converting circuits 20-1 to 20-N are required for the input data D1, D2, ..., and DN, but the operation portions of the FIR circuits 30-1 to 30-N are performed depending on the external output timing signal CK', the FIR operation on the input data D1, D2, ..., and DN can be uniform. Accordingly, a time-division process can be easily performed and a single FIR circuit can be realized. The single circuit cannot be realized by the conventional circuit shown in FIG. 2. In addition, since the output data D1'(Fs'), D2'(Fs'), ..., and DN'(Fs') has the same sampling frequency Fs', the multiplier or the adder for the mixer or the digital amplifiers 50-1 to 50-N can perform a time-division process in the single FIR circuit.

(2) By increasing the internal clock CK1' and the coefficient generator 34, it is possible to easily increase the oversampling magnification ratio and to improve the filter performance such as the S/N ratio without increasing the operation by interpolation of 0 due to FIR.

In addition, even in the operation precision of the filter operation, by speeding up the internal clock CK1', ..., it is possible to easily apply a method of simplifying the operation by the interpolation of 0 due to FIR, to improve resolution of a time axis, and to sufficiently ensure the filter performance. According to the speeding-up of the internal clock CK1', ..., the oversampling magnification ratio of the FIR operation increases and the filter coefficient increases. Since the coefficient generation can be realized by the table such as ROM, a plurality of synchronous serial signals can be resampled by one circuit and an effect is obtained in view of the circuit area.

(3) Since the times of the input timing signals CK1, CK2, ..., and CKN of the input data D1, D2, ..., and DN are measured by the timers 41 and 42 which is operated by the internal timing signal CK' and the ratio of the input timing signals and the output timing signal CK' is calculated by the operation, a filter operation process, which does not depend on the input frequency (interval between the input timing signals CK1, CK2, ... ), can be performed and thus the data signal having any input frequency can be easily resampled by the signal having a specific output frequency.

Configuration of a Second Embodiment

Figure 13:
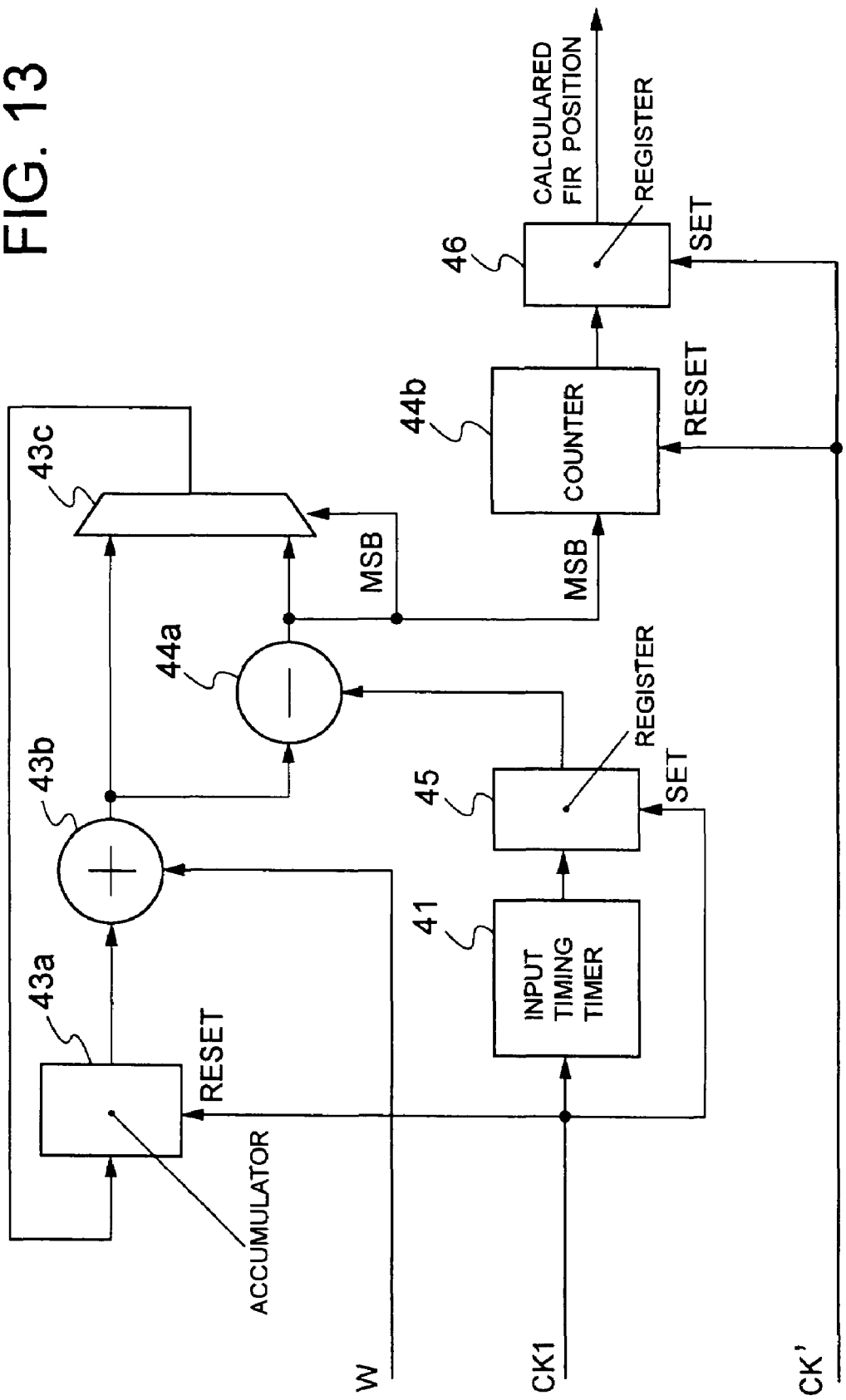
FIG. 13 shows a configuration of a timing generating circuit according to a second embodiment of the present invention.

FIG. 13 shows a configuration of a timing generating circuit according to a second embodiment of the present invention. In FIG. 13, the other configuration (method using addition and subtraction) of the timing generating circuit 40 of FIG. 8 is shown.

The timing generating circuit 40A includes the input timing timer 41 of FIG. 8 for counting the input timing signal CK1, a circuit corresponding to the multiplier 43 of FIG. 8 (a accumulator 43a, a adder 43b, and a first selector 43c), a circuit corresponding to the divider 44 of FIG. 8 (a first subtractor 44a and a counter 44b), a register 45, and a second register 46.

The accumulator 43a is reset by the input timing signal CK1 and accumulates the output value of the selector 43c, and the output side thereof is connected to the adder 43b. The adder 43b adds the output value of the accumulator 43a and the oversampling multiple W and the output side thereof is connected to the selector 43c and the subtractor 44a. The output side of the input timing timer 41 is connected to the register 45 set by the output timing signal CK' and the output side of the register 45 is connected to the subtractor 44a.

The subtractor 44a subtracts the output value of the register 45 from the output value of the adder 43b and the output side thereof is connected to the selector 43c and the counter 44b. The selector 43c selects any one of the output value of the adder 43b and the output value of the subtractor 44a by a sign bit (most significant bit (MSB)) of the output value of the subtractor 44a and supplies the selected output value to the accumulator 43a. The counter 44b is reset by the output timing signal CK' and counts the sign bit (MSB) of the output value of the subtractor 44a, and the output side thereof is connected to the register 46. The register 46 is reset by the output timing signal CK', holds the output value of the counter 44b, and outputs the FIR position to be calculated.

Since the timing generating circuit 40A performs an operation based on the value of the timer 41, the timing generating circuit may be configured by the adder 43b and the subtractor 44a without using the multiplier and the divider. The selector 43c and the counter 44b is operated by the signal bit MSB representing whether the subtraction using the subtractor 44a is possible, and quotient is obtained and held using the register 46 by the output timing signal CK', thereby obtaining the FIR position (timing) to be calculated.

Sampling Rate Converting Method of the Second Embodiment

The interval of the input timing signal CK1 is counted by the input timing timer 41 using a reference clock and held by the register 45 to obtain the input/input time corresponding to the output value of the input timing timer 41 of FIG. 8. The value (corresponding to the multiplied value of the multiplier 43 of FIG. 8) obtained by multiplying the input/output time (corresponding to the output value of the output timing timer 42 of FIG. 8) by the oversampling multiple W is obtained by accumulating and adding the oversampling multiple W by the accumulator 43a and the adder 43b in each clock of the input/output time. In other words, until the input timing signal CK1 is input to the accumulator 43a and the output timing signal CK' is then input to the register 43a, the output of the selector 43c and the oversampling multiple W are added by the adder 43b to generate a value corresponding to the output value of the multiplier of FIG. 8.

The division of the divider 44 of FIG. 8 is realized by subtraction from the result of accumulation and addition of the input/input time in each clock by the subtractor 44a. In a case of a signal which can be subtracted (the result is plus, MSB=0), the subtracted result returns to the accumulator 43a and +1 is added to the counter 44b for calculating quotient, and, in a case of a signal which cannot be subtracted (the result is minus, MSB=1), the accumulated and added value before the subtraction returns to the accumulator 43a. This operation is performed until the output timing to obtain the multiplied and divided FIR position.

Effect of the Second Embodiment

According to the timing generating circuit 40A of the second embodiment, instead of the multiplier 43 and the divider 44 of FIG. 8, it is possible to reduce the circuit scale by combining the adder 43b, the subtractor 44a, the selector 43c, and the counter 44b.

Configuration of a Third Embodiment

Figure 14:
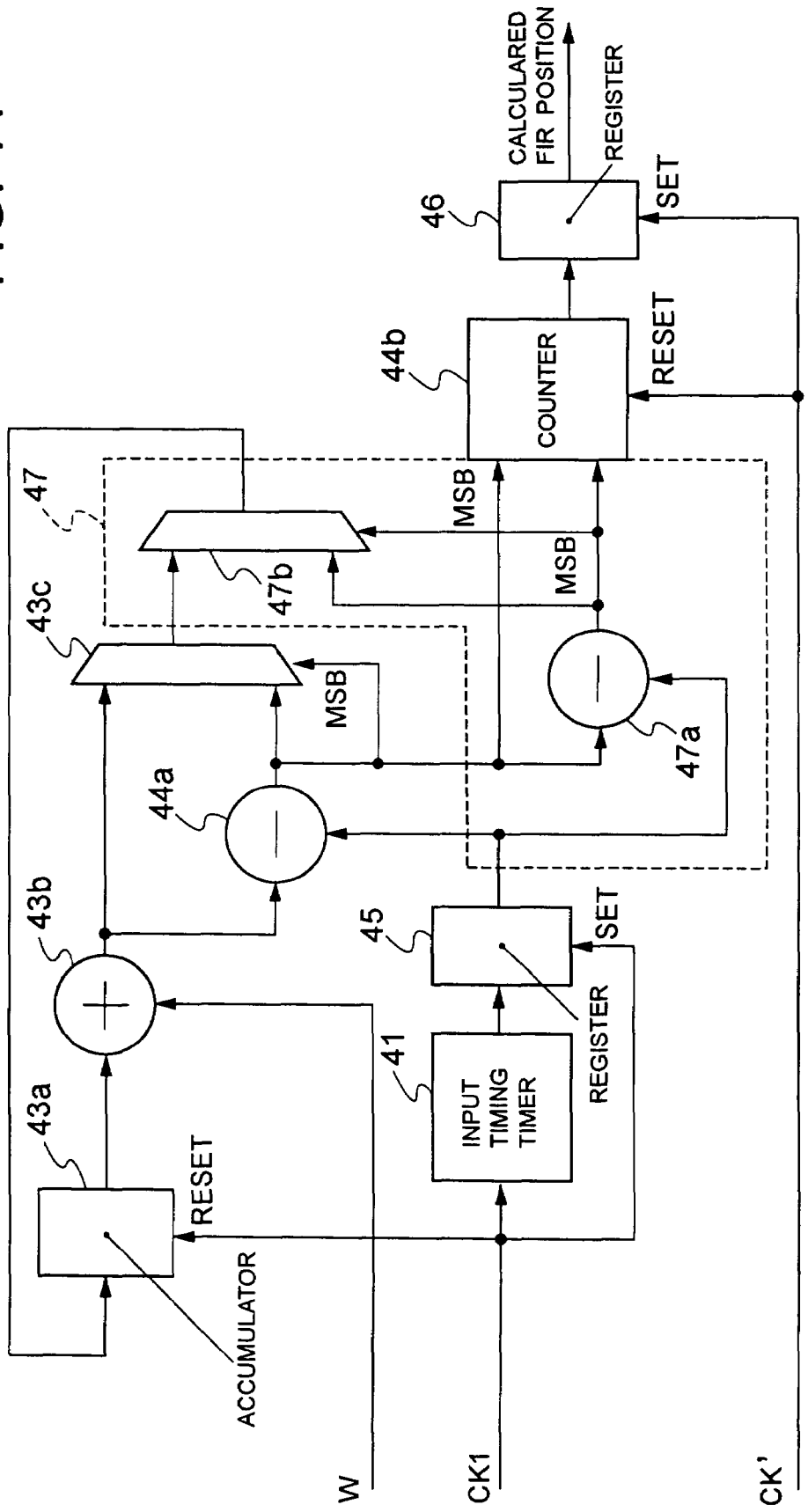
FIG. 14 shows a configuration of a timing generating circuit according to a third embodiment of the present invention.

FIG. 14 shows a configuration of a timing generating circuit according to a third embodiment of the present invention. In FIG. 14, the other configuration (method using addition and subtraction corresponding to downsampling) of the timing generating circuit 40 of FIG. 8 is shown.

In the timing generating circuit 40B, a circuit 47 is added to the timing generating circuit 40A of FIG. 13. The circuit 47 includes a second subtractor 47a for subtracting the output value of the first register 45 from the output value of the first subtractor 44a and a second selector 47b for selecting any one of the output value of the first selector 43c and the output value of the subtractor 47a based on the output value of the subtractor 47a and supplying the selected output value to the accumulator 43a.

Sampling Rate Converting Method of a Third Embodiment and Effect Thereof

In the timing generating circuit 40A of FIG. 13, when the oversampling multiple W (added value) exceeds the input/input time (subtracted value) (upon downsampling), an accurate operation cannot be performed. In order to solve this problem, in the timing generating circuit 40B of the third Embodiment, by adding the circuit 47, it is possible to correspond to ½ times. By increasing the same configuration, it is possible to correspond one-severalth. Thus, the timing generating circuit can be used for the downsampling.

The present invention is not limited to the first to third embodiments, various modifications or usages are possible. A fourth embodiment showing the modification and the usage includes, for example, the following (a) to (c).

(a) Although, in the first to third embodiment, a plurality of synchronous serial transmissions is described, the FIR circuit can be shared by the method of FIG. 12 even in a synchronous or asynchronous parallel transmission and the same method can be used even in an environment that the serial transmission and the parallel transmission is mixed.

(b) When the sampling frequency of the input data has fluctuation such as jitter (conversion of the sampling frequency of the input data, for example, like 44.1 KHz±1%) as well as when a uniform sampling frequency (for example, 44.1 KHz) is rate-converted into the other sampling frequency (for example, 48.0 KHz), the value of the input/input time is sequentially updated such that any input frequency can be resampled to a uniform output frequency. This is because the FIR position for the resampling after the oversampling is calculated by the multiplication and division and thus does not depend on the input frequency.

(c) Although, in FIGS. 8, 13, and 14, the FIR position is calculated by the multiplier 43 and divider 44 or the timer 41 and the adder 43b and the subtractor 44a, since the multiplier 35 and the accumulator 36 are included in the filter unit, it is possible to realize the FIR operation by using the portion in the time division fashion.

What is claimed is:

1. A sampling rate converting method comprising:
an oversampling step of storing input data among the input data and an input timing signal synchronized with the input data in a memory, multiplying the data stored in the memory by a filter coefficient to obtain a first multiplied result, accumulating the first multiplied result to obtain the accumulated result, storing the accumulated result in the memory again, and externally outputting the accumulated result, in which the frequency of the input data is oversampled, as output data;

an input/input time calculating step of calculating an input/input time, which is an interval of the input timing signal, based on the input timing signal;

a multiplied result calculating step of calculating an input/output time from an input of the input timing signal to an output of the output timing signal based on the output timing signal and the input timing signal of the output data and multiplying the input/output time by an oversampling multiple to obtain a second multiplied result;

a dividing step of dividing the second multiplied result by the input/input time to obtain a sampling position; and a coefficient generating step of generating the filter coefficient based on the sampling position and supplying the filter coefficient to the oversampling step.

2. The sampling rate converting method according to claim 1, wherein, in the input/input time calculating step, the input timing signal is timed by an input timing timer to obtain the input/input time which is the interval of the input timing signal, and, in the multiplied result calculating step, the input/output time is timed by an output timing timer to obtain the second multiplied result by a multiplier.

3. The sampling rate converting method according to claim 1, wherein, in the input/input time calculating step, the input timing signal is timed by an input timing timer to obtain the input/input time which is the interval of the input timing signal, in the multiplied result calculating step, using an accumulator reset by the input timing signal, an adder for adding the accumulated result of the accumulator and the oversampling multiple to obtain the second multiplied result, and a first selector, a first subtracted result is selected by the first selector to be accumulated to the accumulator when the second multiplied result is larger than the input/input time, and the second multiplied result is selected by the first selector to be accumulated to the accumulator when the second multiplied result is smaller than the input/input time, and, in the dividing step, the input/input time is subtracted from the second multiplied result by a first subtractor to obtain the first subtracted result, the subtraction number of the first subtractor is counted by a counter reset by the output timing signal to obtain a count value when the second multiplied result is larger than the input/input time, and the count value is held based on the output timing signal to output the sampling position.

4. The sampling rate converting method according to claim 3, further comprising a step of subtracting the input/input time from the first subtracted result by a second subtractor to obtain a second subtracted result and counting the subtraction number by the counter, and a process of selecting the second subtracted result by the second selector and accumulating the second subtracted result to the accumulator when the first subtracted result is larger than the input/input time and selecting output data of the first selector by the second selector and accumulating the output data to the accumulator when the first subtracted result is smaller than the input/input time.

5. The sampling rate converting method according to any one of claim 1, wherein a sampling rate converting step is performed in a time division fashion when plural pieces of input data and a plurality of input timing signals synchronized with the input data.

6. The sampling rate converting method according to any one of claim 2, wherein a sampling rate converting step is performed in a time division fashion when plural pieces of input data and a plurality of input timing signals synchronized with the input data.

7. The sampling rate converting method according to any one of claim 3, wherein a sampling rate converting step is performed in a time division fashion when plural pieces of input data and a plurality of input timing signals synchronized with the input data.

8. The sampling rate converting method according to any one of claim 4, wherein a sampling rate converting step is performed in a time division fashion when plural pieces of input data and a plurality of input timing signals synchronized with the input data.

9. A sampling rate converting circuit comprising:

an oversampling component which stores input data among the input data and an input timing signal synchronized with the input data in a memory, multiplies the data stored in the memory by a filter coefficient to obtain a first multiplied result, accumulates the first multiplied result to obtain the accumulated result, stores the accumulated result in the memory again, and externally outputs the accumulated result, in which the frequency of the input data is oversampled, as output data;

an input/input time calculating component which calculates an input/input time, which is an interval of the input timing signal, based on the input timing signal;

a multiplied result calculating component which calculates an input/output time from an input of the input timing signal to an output of the output timing signal based on the output timing signal and the input timing signal of the output data and multiplies the input/output time by an oversampling multiple to obtain a second multiplied result;

a dividing component which divides the second multiplied result by the input/input time to obtain a sampling position; and a coefficient generating component which generates the filter coefficient based on the sampling position and supplies the filter coefficient to the oversampling component.

10. The sampling rate converting circuit according to claim 9, wherein the input/input time calculating component includes an input timing timer which times the input timing signal to obtain the input/input time which is the interval of the input timing signal, and the multiplied result calculating component includes an output timing timer which times the input/output time and a multiplier which obtains the second multiplied result.

11. The sampling rate converting circuit according to claim 9, wherein the input/input time calculating component includes an input timing timer which times the input timing signal to obtain the input/input time which is the interval of the input timing signal and a first register which holds the input/input time based on the input timing signal, the multiplied result calculating component includes an accumulator reset by the input timing signal, an adder for adding the accumulated result of the accumulator and the oversampling multiple to obtain the second multiplied result, and a first selector for selecting a first subtracted result to accumulate the first subtracted result to the accumulator when the second multiplied result is larger than the input/input time and selecting the second multiplied result to accumulate the second multiplied result to the accumulator when the second multiplied result is smaller than the input/input time, and the dividing component includes a first subtractor for subtracting the input/input time from the second multiplied result to obtain the first subtracted result, a counter reset by the output timing signal and counting the subtraction number of the first subtractor to obtain a count value when the second multiplied result is larger than the input/input time, and a second register for holding the count value based on the output timing signal to output the sampling position.

12. The sampling rate converting circuit according to claim 11, further comprising a second subtractor which subtracts the input/input time from the first subtracted result to obtain a second subtracted result and allows the counter to count the subtraction number, and a second selector which selects the second subtracted result and accumulates the second subtracted result to the accumulator when the first subtracted result is larger than the input/input time and selects output data of the first selector and accumulates the output data to the accumulator when the first subtracted result is smaller than the input/input time.

13. The sampling rate converting circuit according to claim 9, wherein a sampling rate conversion is performed in a time division fashion when plural pieces of input data and a plurality of input timing signals synchronized with the input data.

14. The sampling rate converting circuit according to claim 10, wherein a sampling rate conversion is performed in a time division fashion when plural pieces of input data and a plurality of input timing signals synchronized with the input data.

15. The sampling rate converting circuit according to claim 11, wherein a sampling rate conversion is performed in a time division fashion when plural pieces of input data and a plurality of input timing signals synchronized with the input data.

16. The sampling rate converting circuit according to claim 12, wherein a sampling rate conversion is performed in a time division fashion when plural pieces of input data and a plurality of input timing signals synchronized with the input data.

* * * * *